(12) United States Patent
Ko

(10) Patent No.: US 12,479,645 B2
(45) Date of Patent: Nov. 25, 2025

(54) METHOD FOR PROTECTING LEADFRAME, LEADFRAME COMPOSITE, BOX AND OUTSIDE CONTAINER

(71) Applicant: ADVANCED ASSEMBLY MATERIALS ANHUI LIMITED, Anhui (CN)

(72) Inventor: Ching Leung Lawrence Ko, Shatin (HK)

(73) Assignee: ADVANCED ASSEMBLY MATERIALS ANHUI LIMITED, Anhui (CN)

( * ) Notice: Subject to any disclaimer, the term of this patent is extended or adjusted under 35 U.S.C. 154(b) by 13 days.

(21) Appl. No.: 18/188,345

(22) Filed: Mar. 22, 2023

(65) Prior Publication Data

US 2024/0294322 A1    Sep. 5, 2024

(30) Foreign Application Priority Data

Mar. 3, 2023  (CN) .......................... 202310220015.8

(51) Int. Cl.
| | |
|---|---|
| C23F 11/00 | (2006.01) |
| B65B 5/04 | (2006.01) |
| B65B 55/00 | (2006.01) |
| B65D 21/02 | (2006.01) |
| B65D 21/08 | (2006.01) |
| B65D 65/38 | (2006.01) |
| B65D 81/24 | (2006.01) |
| C23C 14/00 | (2006.01) |
| H01L 23/00 | (2006.01) |
| H01L 23/48 | (2006.01) |
| H01L 23/495 | (2006.01) |

(52) U.S. Cl.
CPC ............... *B65D 81/24* (2013.01); *B65B 5/04* (2013.01); *B65B 55/00* (2013.01); *B65D 21/0201* (2013.01); *B65D 21/0209* (2013.01); *B65D 21/086* (2013.01); *B65D 65/38* (2013.01); *H01L 23/49579* (2013.01); *H01L 23/564* (2013.01)

(58) Field of Classification Search
CPC ......... B65B 55/00; B65B 5/04; H01L 23/495; H01L 23/49537; H01L 23/00; H01L 23/49582; H01L 23/49541; B65D 21/02; B65D 21/08; B65D 65/38; B65D 81/24
USPC ........... 422/32, 186.05; 204/192.25; 257/734
See application file for complete search history.

(56) References Cited

U.S. PATENT DOCUMENTS 5,838,062 A * 11/1998 Hwang ............. H01L 23/49582
                                                             257/750
7,432,584 B2 * 10/2008 Goh .................. H01L 23/49582
                                                             257/734

* cited by examiner

*Primary Examiner* — Monzer R Chorbaji
(74) *Attorney, Agent, or Firm* — Merchant & Gould P.C.

(57) ABSTRACT

A method (10) for protecting leadframe, a leadframe composite (20), a box (26) and an outside container (34) are provided. The method (10) includes: step (12), providing a leadframe (22) of a first standard electrode potential; step (14), providing a protection material (24) of a second standard electrode potential, the second standard electrode potential being lower than the first standard electrode potential; and step (16), contacting the protection material (24) with the leadframe (22) so that the protection material (24) acts as a sacrificial anode to protect the leadframe (22) as a cathode from corrosion/oxidization. Embodiments of the present disclosure may help to protect the leadframe (22) without changing the alloying condition of the leadframe (22), without increasing the processing cost of the leadframe (22), etc.

14 Claims, 5 Drawing Sheets

METHOD FOR PROTECTING LEADFRAME, LEADFRAME COMPOSITE, BOX AND OUTSIDE CONTAINER

CROSS-REFERENCE TO RELATED APPLICATIONS

This application claims the benefit of priority to Chinese Patent Application No. 202310220015.8, filed on Mar. 3, 2023, the entire disclosure of which are incorporated herein by reference.

TECHNICAL FIELD

The present disclosure generally relates to the technical field of integrated circuits, and more particularly to a method for protecting leadframe, a leadframe composite, a box and an outside container.

BACKGROUND

Leadframe is chips carrier of many integrated circuits. The shelf life of a leadframe is largely affected by the oxidation/corrosion of the leadframe. Minor oxidation/corrosion of the leadframe may severely affect the bondability of medium or affect the signal transition in the bonded medium.

Conventional solutions to the oxidation/corrosion of the leadframe so as to protect the leadframe are somewhat unsatisfactory. For example, changing the alloying condition of the leadframe may also affect other mechanical properties of the leadframe. Coating the leadframe usually means an electrochemical procedure involving other tooling, e.g. masking, and Laser Direct Imaging (LDI), which increase the processing cost of the leadframe. In addition, different materials coated to the leadframe will have different surface energies, which affect properties like epoxy bleed out of the leadframe.

In view of the above, a new method for protecting leadframe, a new leadframe composite, a new box and a new outside container are desirable.

SUMMARY

According to one aspect of embodiments of the present disclosure, a method for protecting leadframe comprises steps of: providing a leadframe of a first standard electrode potential; providing a protection material of a second standard electrode potential, the second standard electrode potential being lower than the first standard electrode potential; and contacting the protection material with the leadframe so that the protection material acts as a sacrificial anode to protect the leadframe as a cathode from corrosion/oxidization.

In some embodiments, the leadframe provided in the step of providing a leadframe of a first standard electrode potential comprises Copper or Iron, and the protection material provided in the step of providing a protection material of a second standard electrode potential comprises at least one of Aluminium, Barium, Beryllium, Calcium, Cesium, Francium, Lithium, Magnesium, Potassium, Radium, Rubidium, Sodium, Strontium, and Zinc.

In some embodiments, the leadframe provided in the step of providing a leadframe of a first standard electrode potential comprises a Copper alloy or an Iron alloy, and the protection material provided in the step of providing a protection material of a second standard electrode potential comprises at least one of Aluminium, Barium, Beryllium, Calcium, Cesium, Francium, Lithium, Magnesium, Potassium, Radium, Rubidium, Sodium, Strontium, and Zinc.

In some embodiments, the first standard electrode potential is in a range of from −0.5V to 0.8V, by using Standard Hydrogen Electrode.

In some embodiments, the second standard electrode potential is in a range of from −3.5V to −0.7V, by using Standard Hydrogen Electrode.

In some embodiments, the step of contacting the protection material with the leadframe comprises: directly contacting the protection material with the leadframe.

In some embodiments, the step of contacting the protection material with the leadframe comprises: indirectly contacting the protection material with the leadframe.

In some embodiments, the step of contacting the protection material with the leadframe comprises: packaging the leadframe with a box comprising the protection material.

In some embodiments, the step of contacting the protection material with the leadframe comprises: packaging the leadframe with a box made of the protection material.

In some embodiments, the step of contacting the protection material with the leadframe comprises: packaging the leadframe with a box comprising the protection material and a movable wall.

In some embodiments, the step of contacting the protection material with the leadframe comprises: packaging the leadframe with a box comprising the protection material contactable with one side of the leadframe.

In some embodiments, the box comprises a conductive medium contactable with the protection material and the one side of the leadframe.

In some embodiments, the step of contacting the protection material with the leadframe comprises: stacking the leadframe with the protection material in a box.

In some embodiments, the step of contacting the protection material with the leadframe comprises: contacting the protection material with a surface of the leadframe in a box.

In some embodiments, the step of contacting the protection material with the leadframe comprises: disposing the protection material face to face with the leadframe in a box.

In some embodiments, the step of contacting the protection material with the leadframe comprises: accommodating a box packaging the leadframe in a space of an outside container comprising the protection material.

According to another aspect of embodiments of the present disclosure, a leadframe composite comprises: a leadframe of a first standard electrode potential; and a protection material contacted with the leadframe and having a second standard electrode potential lower than the first standard electrode potential so that the protection material acts as a sacrificial anode to protect the leadframe as a cathode from corrosion/oxidization.

In some embodiments, the leadframe comprises Copper or Iron, and the protection material comprises at least one of Aluminium, Barium, Beryllium, Calcium, Cesium, Francium, Lithium, Magnesium, Potassium, Radium, Rubidium, Sodium, Strontium, and Zinc.

In some embodiments, the leadframe comprises a Copper alloy or an Iron alloy, and the protection material comprises at least one of Aluminium, Barium, Beryllium, Calcium, Cesium, Francium, Lithium, Magnesium, Potassium, Radium, Rubidium, Sodium, Strontium, and Zinc.

In some embodiments, the first standard electrode potential is in a range of from −0.5V to 0.8V, by using Standard Hydrogen Electrode.

In some embodiments, the second standard electrode potential is in a range of from −3.5V to −0.7V, by using Standard Hydrogen Electrode.

In some embodiments, the protection material is directly contacted with the leadframe.

In some embodiments, the protection material is indirectly contacted with the leadframe.

In some embodiments, the leadframe composite comprises: a box packaging the leadframe and made of the protection material.

In some embodiments, the leadframe composite comprises: a box packaging the leadframe and comprising the protection material.

In some embodiments, the box comprises a movable wall.

In some embodiments, the protection material is contacted with one side of the leadframe in the box.

In some embodiments, the box comprises a conductive medium contacting with the protection material and the one side of the leadframe.

In some embodiments, the protection material is stacked with the leadframe in the box.

In some embodiments, the protection material is contacted with a surface of the leadframe in the box.

In some embodiments, the protection material is disposed face to face with the leadframe in the box.

In some embodiments, the leadframe composite comprises: an outside container comprising the protection material and a space for accommodating a box packaging the leadframe.

According to yet another aspect of embodiments of the present disclosure, a box for packaging a leadframe of a first standard electrode potential comprises: a protection material contactable with the leadframe and having a second standard electrode potential lower than the first standard electrode potential so that the protection material acts as a sacrificial anode to protect the leadframe as a cathode from corrosion/oxidization.

In some embodiments, the box is made of the protection material.

In some embodiments, the box comprises a movable wall.

In some embodiments, the protection material is contactable with one side of the leadframe.

In some embodiments, the box comprises: a conductive medium contactable with both the protection material and the one side of the leadframe.

In some embodiments, the protection material is stackable with the leadframe in the box.

In some embodiments, the protection material is contactable with a surface of the leadframe in the box.

In some embodiments, the protection material is disposable face to face with the leadframe in the box.

According to still another aspect of embodiments of the present disclosure, an outside container for protecting a leadframe of a first standard electrode potential comprises: a space for accommodating a box packaging the leadframe; and a protection material contactable with the leadframe and having a second standard electrode potential lower than the first standard electrode potential so that the protection material acts as a sacrificial anode to protect the leadframe as a cathode from corrosion/oxidization.

As long as technical conditions permit, technical features of various embodiments of the present disclosure may be combined to constitute new embodiments not disclosed herein and within the protection scope.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
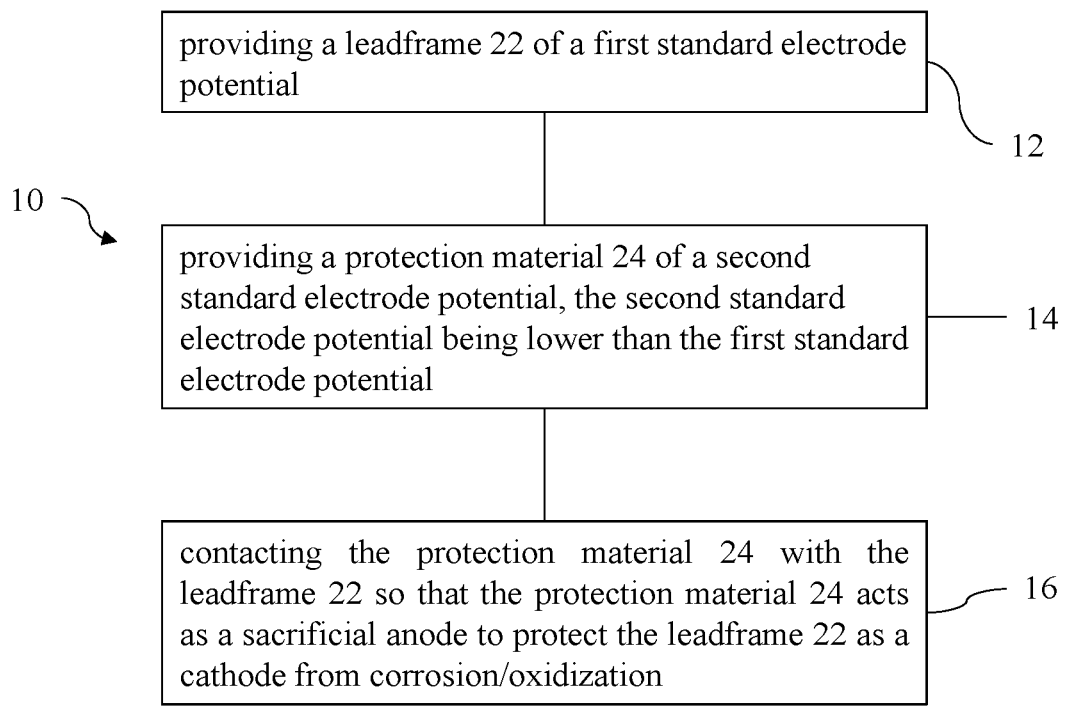
FIG. 1 illustrates a schematic flow chart of a method for protecting leadframe according to one aspect of embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Figure 2:
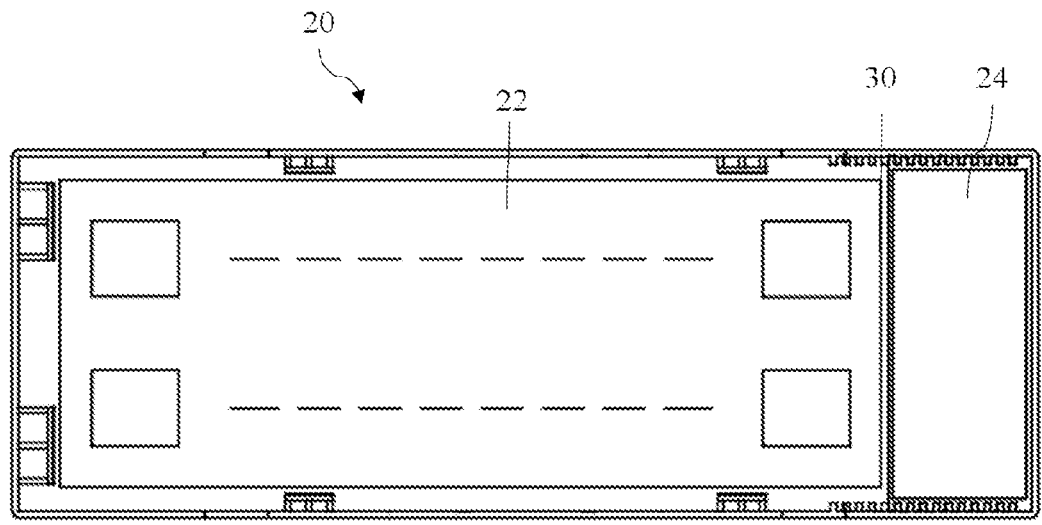
FIG. 2 illustrates a top planar view of a leadframe composite according to a first embodiment of the present disclosure.

FIG. 1 illustrates a schematic flow chart of a method for protecting leadframe according to one aspect of embodiments of the present disclosure. FIG. 2 illustrates a top planar view of a leadframe composite according to a first embodiment of the present disclosure.

Referring to FIGS. 1-2, according to one aspect of embodiments of the present disclosure, a method 10 for protecting leadframe comprises: step 12, providing a leadframe 22 of a first standard electrode potential; step 14, providing a protection material 24 of a second standard electrode potential, the second standard electrode potential being lower than the first standard electrode potential; and step 16, contacting the protection material 24 with the leadframe 22 so that the protection material 24 acts as a sacrificial anode to protect the leadframe 22 as a cathode from corrosion/oxidization.

According to another aspect of embodiments of the present disclosure, a leadframe composite 20 comprises: a leadframe 22 of a first standard electrode potential; and a protection material 24 contacted with the leadframe 22 and having a second standard electrode potential lower than the first standard electrode potential so that the protection material 24 acts as a sacrificial anode to protect the leadframe 22 as a cathode from corrosion/oxidization.

In embodiments of the present disclosure, the leadframe 22 may be one of basic parts of an integrated circuit (IC). The function of the leadframe 22 may include fixing the IC, providing a mechanical carrier, protecting inner component(s), transmitting electric signal, etc. The leadframe 22 may subject to corrosion/oxidization when exposed in the environment, e.g., after a period of time without protection and/or when the protection, if any, fails.

When the protection material 24 is contacted with the leadframe 22, as the second standard electrode potential of the protection material 24 is lower than the first standard electrode potential of the material of the leadframe 22, the protection material 24 tends to release electron before the leadframe 22 and react with the oxygen and/or corrosion material(s). In other words, the protection material 24 acts as a sacrificial anode and "attracts" the corrosion/oxidization to them rather than the leadframe 22. The leadframe 22 becomes the cathode and does not corrode/oxidize before the protection material 24, thereby being protected by the protection material 24 from corrosion/oxidization.

Embodiments of the present disclosure contact the protection material 24 with the leadframe 22 without changing the alloying condition of the leadframe 22, so material properties, such as mechanical, electrical, thermal, etc. properties of the leadframe 22 are not affected by the protection material 24.

Embodiments of the present disclosure contact the protection material 24 with the leadframe 22 without involving other tooling, e.g., masking and/or Laser Direct Imaging (LDI), and do not increase the processing cost of the leadframe 22. In addition, embodiments of the present disclosure do not affect properties like epoxy bleed out of the leadframe 22.

In embodiments of the present disclosure, the protection material 24 is contacted with the leadframe 22 without fixation therebetween and does not interfere with the leadframe 22 in functioning, handling, moving etc. The protection material 24 may be easily contacted with and/or separated from the leadframe 22. Embodiments of the present disclosure are economical as there will not be additional cost for contacting and/or separating the protection material 24 and the leadframe 22.

On the other hand, if the protection material, e.g., in a form of pin is inserted into, e.g., a hole of a leadframe, there is a fixation between the pin and the hole. The pin in the hole hinders the functioning, handling, moving, molding, automatic visual inspection (AVI), etc. of the leadframe. For example, the insertion and retreat of the pin may deform the hole which affect the inspection accuracy of AVI. In addition, the insertion of the pin into the hole and/or the retreat of the pin from the hole needs additional processing cost, so it is not economical and undesirable for most, if not all, players in the IC industry.

In embodiments of the present disclosure, the leadframe 22 may comprise metal or metal alloy. In embodiments of the present disclosure, the protection material 24 may comprise material more reactive in corrosion/oxidization than the leadframe 22. The protection material 24 may comprise metal. The protection material 24 may comprise Alkali metal and/or Alkaline earth metal.

In some embodiments, the leadframe 22 comprises Copper or Iron, and the protection material 24 comprises at least one of Aluminium, Barium, Beryllium, Calcium, Cesium, Francium, Lithium, Magnesium, Potassium, Radium, Rubidium, Sodium, Strontium, and Zinc.

In some embodiments, the leadframe 22 comprises a Copper alloy or an Iron alloy, and the protection material 24 comprises at least one of Aluminium, Barium, Beryllium, Calcium, Cesium, Francium, Lithium, Magnesium, Potassium, Radium, Rubidium, Sodium, Strontium, and Zinc.

The numerical value of the first standard electrode potential may be different based on the specific material of the leadframe 22, the type of standard electrode, the temperature, etc.

In some embodiments, the first standard electrode potential is in a range of from −0.5V to 0.8V, by using Standard Hydrogen Electrode.

For example, by using Standard Hydrogen Electrode at 25° C., i.e., where Hydrogen has a standard electrode potential of 0V in the reduction half-reaction of $2H^+$ (aq)+$2e^- \rightarrow H_2$ (g), Copper has a standard electrode potential of 0.34V in the reduction half-reaction of $Cu^{2+}$ (aq)+$2e^- \rightarrow$ Cu (s), Iron has a standard electrode potential of −0.45V in the reduction half-reaction of $Fe^{2+}$ (aq)+$2e^- \rightarrow$Fe (s) or 0.77V in the reduction half-reaction of $Fe^{3+}$ (aq)+$e^- \rightarrow Fe^{2+}$ (aq).

Unless otherwise specified, numerical values in this disclosure include measurement, accuracy, metering and other errors, such as errors within +5%. For example, −0.5 may include values in the range of −0.525 to −0.475.

Unless otherwise specified, the numerical range in this application includes any sub range therein, for example, −0.5 to 0.8 may include −0.4 to 0.8, −0.3 to 0.8, −0.2 to 0.8, −0.1 to 0.8, −0.5 to 0.7, −0.5 to 0.6, −0.5 to 0.5, −0.5 to 0.4, −0.5 to 0.3, −0.5 to 0.2, and so on.

The numerical value of the second standard electrode potential may be different based on the specific material of the protection material 24, the type of standard electrode, the temperature, etc.

In some embodiments, the second standard electrode potential is in a range of from −3.5V to −0.7V, by using Standard Hydrogen Electrode.

For example, by using Standard Hydrogen Electrode at 25° C., i.e., where Hydrogen has a standard electrode potential of 0V in the reduction half-reaction of $2H^+$ (aq)+$2e^- \rightarrow H_2$ (g), Lithium has a standard electrode potential of −3.04V in the reduction half-reaction of $Li^+$ (aq)+$e^- \rightarrow$ Li (s), Sodium has a standard electrode potential of −2.71V in the reduction half-reaction of $Na^+$ (aq)+$e^- \rightarrow$Na (s), Magnesium has a standard electrode potential of −2.37V in the reduction half-reaction of $Mg^{2+}$ (aq)+$2e^- \rightarrow$Mg (s), Zinc has a standard electrode potential of −0.76V in the reduction half-reaction of $Zn^{2+}$ (aq)+$2e^- \rightarrow$Zn (s), and so on.

When the protection material 24 is contacted with the leadframe 22, the protection material 24 may donate electrons to the leadframe 22 to prevent it from oxidization/corrosion. The leadframe 22 which is oxidized may be immediately reduced back when receiving the electrons donated by the protection material 24.

For example, in an embodiment where the protection material 24 comprises Magnesium (Mg) and the leadframe 22 comprises Iron (Fe), the electron donation between the protection material 24 and the leadframe 22 is shown below:

$$Mg \leftrightarrow Mg^{2+}+2e^-, Fe^{2+}+2e^- \leftrightarrow Fe.$$

In an experiment of contacting a Zinc protection material with a Copper leadframe, it was found the Zinc protection material corroded/oxidized first and until the Zinc protection material massively sacrificed, the level of oxidation/corrosion in the Copper leadframe was still industrially acceptable for the later process.

The step 16 of contacting the protection material 24 with the leadframe 22 may be performed in any applicable way as long as the protection material 24 acts as a sacrificial anode to protect the leadframe 22 as a cathode from corrosion/oxidization.

The protection material 24 of the leadframe composite 20 may be contacted with the leadframe 22 in any applicable way as long as the protection material 24 acts as a sacrificial anode to protect the leadframe 22 as a cathode from corrosion/oxidization.

In some embodiments, the step 16 of contacting the protection material 24 with the leadframe 22 comprises: directly contacting the protection material 24 with the leadframe 22.

In some embodiments, the protection material 24 of the leadframe composite 20 is directly contacted with the leadframe 22.

Directly contacting the protection material 24 with the leadframe 22 helps with, e.g., protecting the leadframe 22 from corrosion/oxidization in a simple way and/or with a relatively low cost.

The protection material 24 may be disposed adjacent to the leadframe 22 to directly contact with the leadframe 22.

Figure 3:
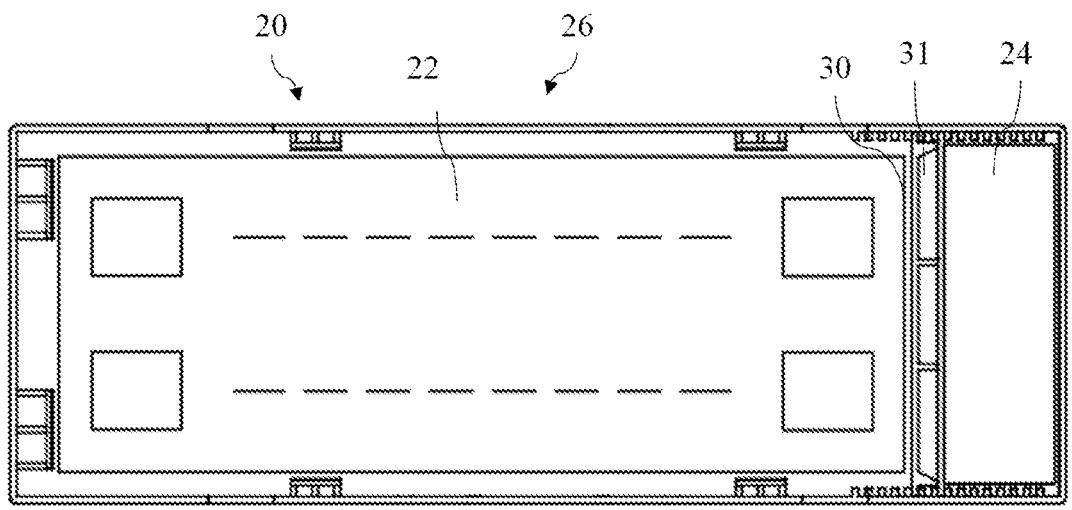
FIG. 3 illustrates a top planar view of a leadframe composite according to a second embodiment of the present disclosure.

FIG. 3 illustrates a top planar view of a leadframe composite according to a second embodiment of the present disclosure. As is also shown in FIG. 3, in some embodiments, the step 16 of contacting the protection material 24 with the leadframe 22 comprises: indirectly contacting the protection material 24 with the leadframe 22.

In some embodiments, the protection material 24 of the leadframe composite 20 is indirectly contacted with the leadframe 22.

Indirectly contacting the protection material 24 with the leadframe 22 helps with, e.g., protecting the leadframe 22 from corrosion/oxidization with relatively flexible arrangement of the protection material 24 with respect to the leadframe 22. The protection material 24 does not have to be adjacent to the leadframe 22. There may be space, distance between the protection material 24 and the leadframe 22.

The protection material 24 may be contacted with the leadframe 22 through a conductive medium 31 therebetween to indirectly contact with the leadframe 22.

The protection material 24 may be contacted with the leadframe 22 through a conductive medium covering the protection material 24 to indirectly contact with the leadframe 22. In an embodiment not shown in drawings, a protection material Zinc may be covered by an electrically conductive foil to constitute an electrically conductive foil+Zinc bulk and is indirectly contacted with the leadframe when the electrically conductive foil+Zinc bulk is in direct or indirect contact with the leadframe.

In embodiments of the present disclosure, the protection material 24 may be in any form, shape, configuration, etc., so long as it contacts with the leadframe 22 and acts as a sacrificial anode to protect the leadframe 22 as a cathode from corrosion/oxidization.

Unless context dictates otherwise, the protection material 24 may be an article, a component of an article, a portion of an article, a composition of an article, etc.

For example, if an article is completely made of the protection material 24, the protection material 24 may be the article or the composition of the article. If an article is made of the protection material 24 and other material(s), the protection material 24 may be the composition of the article.

If a component of an article is completely or partly made of the protection material 24, the protection material 24 may be the component of the article, or the composition of the component of the article.

If a portion of an article is completely or partly made of the protection material 24, the protection material 24 may be the portion of the article, or the composition of the portion of the article.

Figure 4:
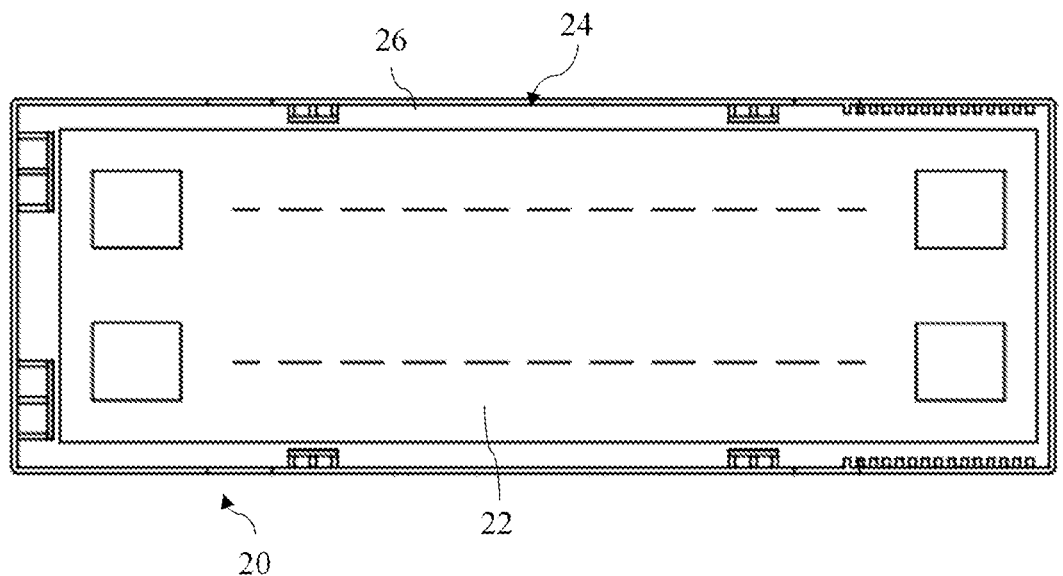
FIG. 4 illustrates a top planar view of a leadframe composite according to a third embodiment of the present disclosure.

FIG. 4 illustrates a top planar view of a leadframe composite according to a third embodiment of the present disclosure. Referring also to FIG. 4, in some embodiments, the step 16 of contacting the protection material 24 with the leadframe 22 comprises: packaging the leadframe 22 with a box 26 made of the protection material 24.

In some embodiments, the leadframe composite 20 comprises: a box 26 packaging the leadframe 22 and made of the protection material 24.

One or more of the leadframe 22 may be packaged in the box 26. The box 26 may have a configuration, shape, size, etc., corresponding to the leadframe 22, to receive and accommodate the leadframe 22. For example, as is shown in FIG. 4, when the leadframe 22 is a rectangular sheet, the box 26 may be a rectangular box. The box 26 may at least partly surround the leadframe 22 to separate the leadframe 22 from the environment to protect the leadframe 22 from physical damage, etc. while the leadframe 22 is contacted with any portion of the box 26 made of the protection material 24 to be protected from corrosion/oxidization.

In some embodiments, the step 16 of contacting the protection material 24 with the leadframe 22 comprises: packaging the leadframe 22 with a box 26 comprising the protection material 24.

In some embodiments, the leadframe composite 20 comprises: a box 26 packaging the leadframe 22 and comprising the protection material 24.

According to yet another aspect of embodiments of the present disclosure, a box 26 for packaging a leadframe 22 of a first standard electrode potential, comprises: a protection material 24 contactable with the leadframe 22 and having a second standard electrode potential lower than the first standard electrode potential so that the protection material 24 acts as a sacrificial anode to protect the leadframe 22 as a cathode from corrosion/oxidization.

The box 26 comprising the protection material 24 may be completely or partly made of the protection material 24. The box 26 may comprise a protection component, part, side, wall, portion, and the like completely or partly made of the protect material 24. The leadframe 22 may be contacted with the protection component, part, side, wall, portion, and the like to be protected from corrosion/oxidization, while being packaged with the box 26 to be at least partly separated from the environment to be protected from physical damage, etc. The protection component, part, side, wall, portion, and the like may be fixed to or detachable from other component, part, side, wall, portion, and the like of the box 26.

As is shown in FIG. 4, the size of the leadframe 22 may be compatible with that of the box. 26, so that the relative movement between the leadframe 22 and the box 26 is limited to avoid or reduce mutual damage of the leadframe 22 and the box 26.

The box 26 packaging the leadframe 22 may help to secure the contact between the protection material 24 and the leadframe 22, e.g., by way of keeping the protection material 24 and the leadframe 22 in places meant to be.

Figure 5:
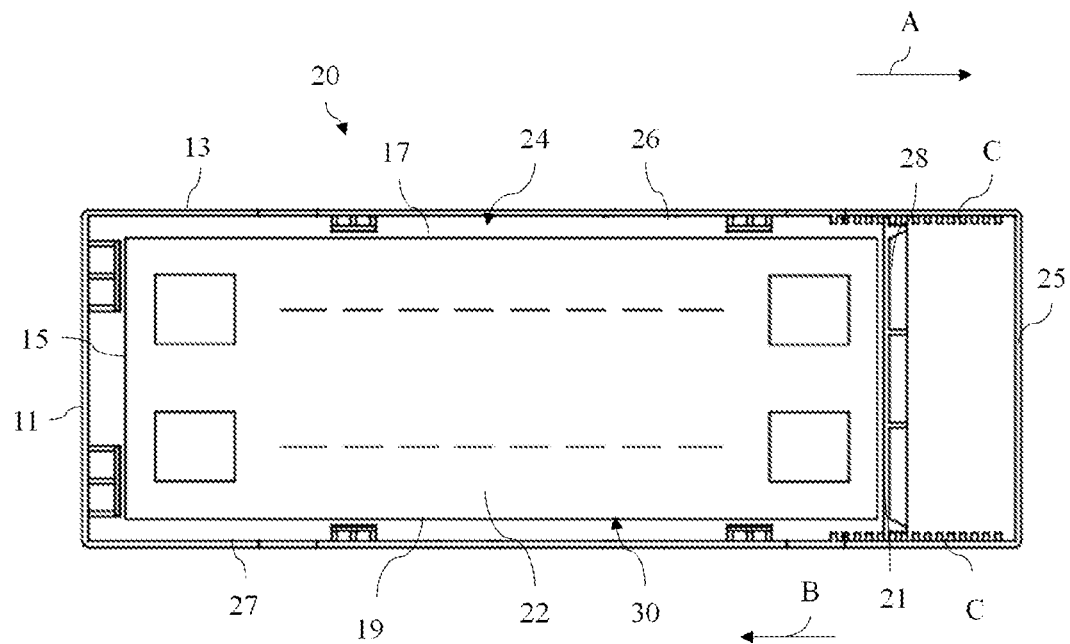
FIG. 5 illustrates a top planar view of a leadframe composite according to a fourth embodiment of the present disclosure.

FIG. 5 illustrates a top planar view of a leadframe composite according to a fourth embodiment of the present disclosure. Please also refer to FIG. 5, in some embodiments, the step 16 of contacting the protection material 24 with the leadframe 22 comprises: packaging the leadframe 22 with a box 26 comprising the protection material 24 and a movable wall 28.

In some embodiments, the box 26 of the leadframe composite 20 comprises a movable wall 28.

In some embodiments, the box 26 comprising the protection material 24 comprises a movable wall 28.

The movable wall 28 may help to locate the leadframe 22 in the box 26, e.g. when the box 26 has a size bigger than the leadframe 22. For example, when a leadframe 22 of a size smaller than a box 26 is packaged in the box 26, one or more side of the leadframe 22 may not reach one or more wall of the box 26 while other side(s) of the leadframe 22 is contacted with other wall(s) of the box 26. The movable wall 28 may be moved to contact the one or more side of the leadframe 22 to limit the movement of the leadframe 22 with respect to the box 26, so that damage caused by movement between the leadframe 22 and the box 26 may be reduced or avoided.

In one embodiment, referring to FIG. 5, the leadframe 22 is shorter than the box 26 and the right side 21 of the leadframe 22 does not reach the corresponding right wall 25 of the box 26, while the front side 19, the rear side 17, and the left side 15 of the leadframe 22 correspond respectively to the front wall 27, the rear wall 13, and the left wall 11 of the box 26. The movable wall 28 is located adjacent to the right side 21 of the leadframe 22 and away from the right wall 25 of the box 26. The movable wall 28 may locate the leadframe 22 together with the left wall 11, the front wall 27 and the rear wall 13 of the box 26.

The movable wall 28 may help leadframes of different sizes sharing boxes with the same size. In embodiments not shown in figures, when a leadframe longer than the leadframe 22 in FIG. 5 but shorter than the box 26 is packaged in the box 26, the movable wall 28 may be moved along a direction A and closer to the right wall 25 of the box 26 to locate the leadframe. Similarly, when a leadframe shorter than the leadframe 22 and the box 26 in FIG. 5 is packaged in a box having the same size as the box 26 in FIG. 5, the movable wall 28 may be moved along the direction B and away from the right wall 25 of the box 26 to locate the leadframe.

The front wall 27 and the rear wall 13 of the box 26 may comprise opposite locating structures C along the direction A and/or direction B to engage with front and rear sides of the movable wall 28 and locate the movable wall 28 at corresponding position. The locating structures C may comprise slots capable of receiving the corresponding front and rear sides of the movable wall 28.

Unless otherwise specified, terms "front", "rear", "left", "right", "top", "bottom", or the like may refer to the positional arrangement of the drawings and/or in use and are not intended to limit the protection scope in this respect.

The movable wall 28 may or may not comprise the protection material 24.

The movable wall 28 may or may not be electrically conductive. If the movable wall 28 is electrically conductive, the movable wall 28 may be a conductive medium for the leadframe 22 and the protection material 24.

In some embodiments, the step 16 of contacting the protection material 24 with the leadframe 22 comprises: packaging the leadframe 22 with a box 26 comprising the protection material 24 contactable with one side 30 of the leadframe 22.

In some embodiments, the protection material 24 of the leadframe composite 20 is contacted with one side 30 of the leadframe 22.

In some embodiments, the protection material 24 of the box 26 is contactable with one side 30 of the leadframe 22.

When the protection material 24 is contacted with the one side 30 of the leadframe 22, the protection material 24 is contacted with the leadframe 22 in a lateral direction, thereby saving a vertical space. The protection material 24 does not contact with and/or interfere with portions of the leadframe 22 other than the contacted side 30, and is easily contacted with and/or separated from the leadframe 22.

The leadframe 22 may be disposed side by side with the protection material 24 in the box 26 so that the protection material 24 is contacted with the adjacent side 30 of the leadframe 22.

As used herein, terms "a", "an", "one", or the like may refer to one or more and are not meant to limit the number unless context dictates otherwise.

The one side 30 of the leadframe 22 may be one or more of the right side 21, the front side 19, the rear side 17, and the left side 15 of the leadframe 22.

As is shown in FIG. 3, in some embodiments, the box 26 in the step 16 comprises a conductive medium 31 contactable with both the protection material 24 and the one side 30 of the leadframe 22.

In some embodiments, the box 26 of the leadframe composite 20 comprises a conductive medium 31 contacting with both the protection material 24 and the one side 30 of the leadframe 22.

In some embodiments, the box 26 comprising the protection material 24 comprises a conductive medium 31 contactable with both the protection material 24 and the one side 30 of the leadframe 22.

The conductive medium 31 is electrically conductive and helps to contact the protection material 24 with the one side 30 of the leadframe 22.

When the leadframe 22 is packaged in the box 26, the protection material 24 may be spaced from and electrically connected with the one side 30 of the leadframe 22 by the conductive medium 31 therebetween.

Figure 6:
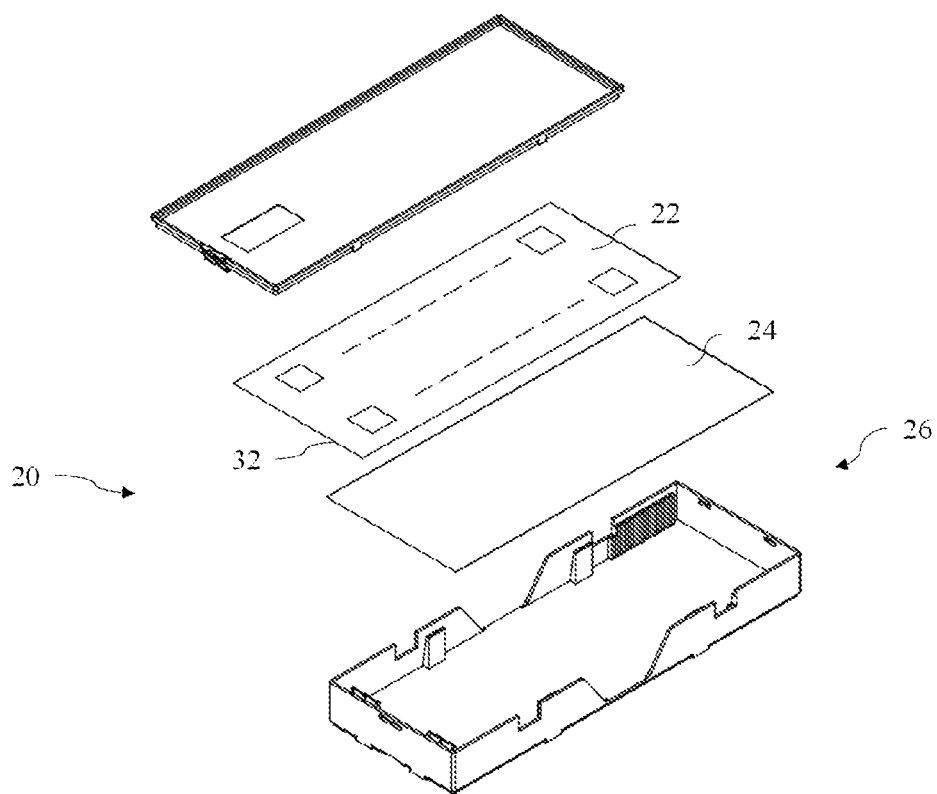
FIG. 6 illustrates an exploded perspective view of a leadframe composite according to a fifth embodiment of the present disclosure.
Figure 7:
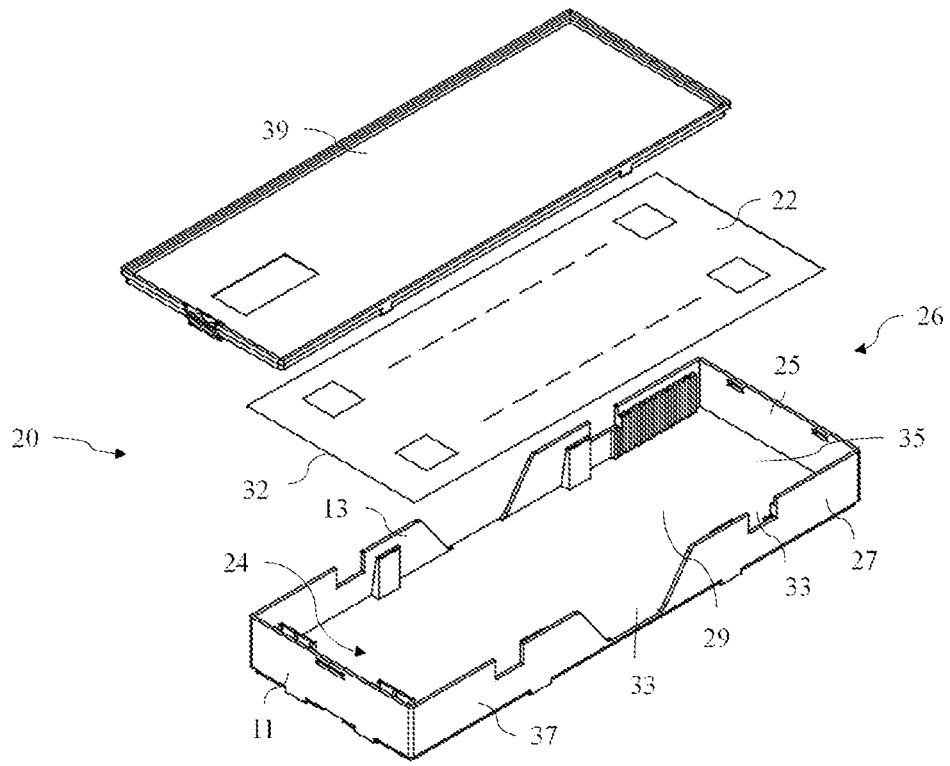
FIG. 7 illustrates an exploded perspective view of a leadframe composite according to a sixth embodiment of the present disclosure.

FIG. 6 illustrates an exploded perspective view of a leadframe composite according to a fifth embodiment of the present disclosure. FIG. 7 illustrates an exploded perspective view of a leadframe composite according to a sixth embodiment of the present disclosure. Referring also to FIGS. 6 and 7, in some embodiments, the step 16 of contacting the protection material 24 with the leadframe 22 comprises: stacking the leadframe 22 with the protection material 24 in a box 26.

In some embodiments, the protection material 24 of the leadframe composite 20 is stacked with the leadframe 22 in the box 26.

In some embodiments, the protection material 24 of the box 26 is stackable with the leadframe 22 in the box 26.

The protection material 24 stacked with the leadframe 22 may have size, shape, configuration the same as or different from the leadframe 22. For example, as is shown in FIG. 6, the protection material 24 may be in a rectangular sheet similar with the leadframe 22 and detachable from other portions of the box 26. In another example, as is shown in FIG. 7, when a bottom wall 35 of the box 26 fixed to the right wall 25, the front wall 27, the rear wall 13, and the left wall 11 of the box 26 comprises the protection material 24, at least the leadframe 22 stacked with the bottom wall 35 is protected by the protection material 24 of the bottom wall 35.

When stacked, the protection material 24 may be contacted with the leadframe 22 in an up and down direction, and a lateral space may be saved.

The box 26 may include a receiving portion 37 defining a cavity 29 therein for receiving and accommodating the leadframe 22. The cavity 29 may be open upwardly. The box 26 may have a cover 39 engageable with the receiving portion 37. The cover 39 may enclose together with the receiving portion 37 the leadframe 22 therebetween. The receiving portion 37 may include window(s) 33 in the front wall 27 and the rear wall 13 of the cavity 29. The cover 39 may be a plate opposite to the bottom wall 35 of the cavity 29 and constitute the top wall of the cavity 29 when engaged with the front wall 27, the rear wall 13, the left wall 11, and the right wall 25 of the receiving portion 37. In some embodiments, the box 26 may only include the receiving portion 37 and does not have the cover 39.

In some embodiments, the step 16 of contacting the protection material 24 with the leadframe 22 comprises: contacting the protection material 24 with a surface 32 of the leadframe 22 in a box 26.

In some embodiments, the protection material 24 of the leadframe composite 20 is contacted with a surface 32 of the leadframe 22 in the box 26.

In some embodiments, the protection material 24 of the box 26 is contactable with a surface 32 of the leadframe 22 in the box 26.

The protection material 24 contacting/contacted/contactable with a surface 32 of the leadframe 22 may have a surface contact with the leadframe 22 and is easily contacted with and/or separated from the leadframe 22.

If the protection material 24 is stacked with the leadframe 22, the protection material 24 may be contacted with an upper surface and/or a lower surface of the leadframe 22.

In some embodiments, the step 16 of contacting the protection material 24 with the leadframe 22 comprises: disposing the protection material 24 face to face with the leadframe 22 in a box 26.

In some embodiments, the protection material 24 of the leadframe composite 20 is disposed face to face with the leadframe 22 in the box 26.

In some embodiments, the protection material 24 of the box 26 is disposable face to face with the leadframe 22 in the box 26.

The protection material 24 disposed/disposable face to face with the leadframe 22 may be easily and securely contacted with the leadframe 22 without fixation therebetween in the box 26.

If the leadframe 22 is a rectangular sheet like the ones shown in figures, the protection material 24 may be stacked in an up and down direction with the leadframe 22 to be disposed face to face with the leadframe 22.

Figure 8:
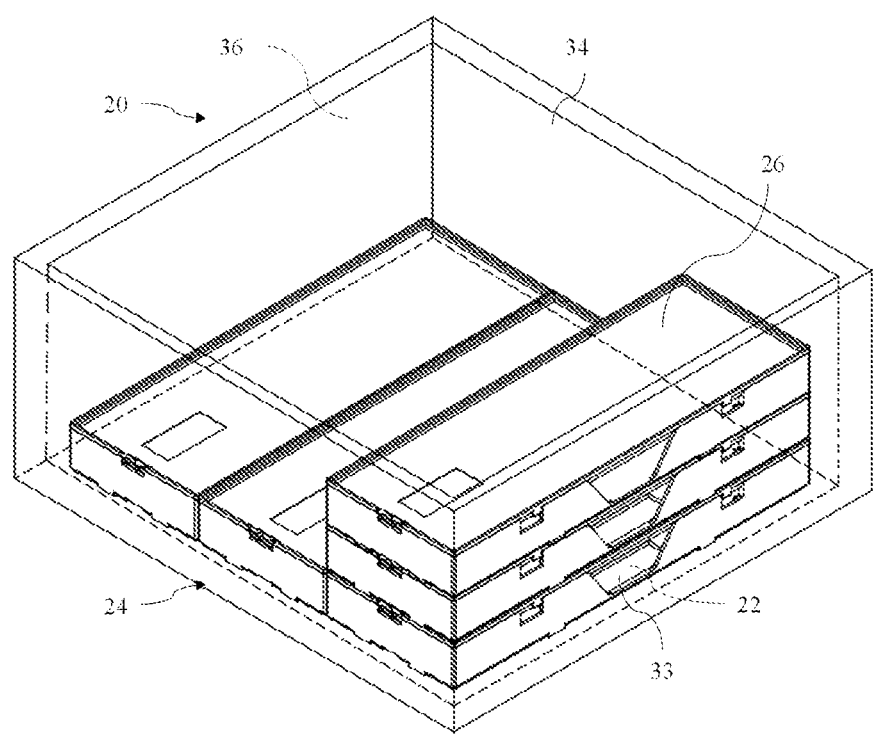
FIG. 8 illustrates a perspective view of a leadframe composite according to a seventh embodiment of the present disclosure.

FIG. 8 illustrates a perspective view of a leadframe composite according to a seventh embodiment of the present disclosure. As is also shown in FIG. 8, in some embodiments, the step 16 of contacting the protection material 24 with the leadframe 22 comprises: accommodating a box 26 packaging the leadframe 22 in a space 36 of an outside container 34 comprising the protection material 24.

In some embodiments, the leadframe composite 20 comprises: an outside container 34 comprising the protection material 24 and a space 36 for accommodating a box 26 packaging the leadframe 22.

According to still another aspect of embodiments of the present disclosure, an outside container 34 for protecting a leadframe 22 of a first standard electrode potential comprises: a space 36 for accommodating a box 26 packaging the leadframe 22; and a protection material 24 contactable with the leadframe 22 and having a second standard electrode potential lower than the first standard electrode potential so that the protection material 24 acts as a sacrificial anode to protect the leadframe 22 as a cathode from corrosion/oxidization.

Both the box 26 and the outside container 34 may at least partly surround the leadframe 22 and help to separate the leadframe 22 from the environment to protect the leadframe 22 from physical damage, etc. in storage and/or transportation, while the leadframe 22 is contacted with the protection material 24 of the outside container 34 to be protected from corrosion/oxidization.

The outside container 34 may be partly or completely made of the protection material 24. If the outside container 34 is completely made of the protection material 24, the leadframe 22 may be contacted with any portion of the outside container 34 to be protected from corrosion/oxidization.

If the outside container 34 is not completely made of the protection material 24, the outside container 34 may comprise a protection component, part, side, wall, portion, and the like, completely or partly made of the protection material 24. The protection component, part, side, wall, portion, and the like may be fixed to or detachable from other component, part, side, wall, portion, and the like of the outside container 34. The leadframe 22 may be contacted with the protection component, part, side, wall, portion, and the like to be protected from corrosion/oxidization.

The protection material 24 of the outside container 34 may be contacted with the leadframe 22 in the box 26 through a conductive medium (not shown, such as a conductive wire). If the box 26 is partly or completely electrically conductive, the protection material 24 of the outside container 34 may be contacted with the leadframe 22 in the box 26 through the electrically conductive portion of the box 26. If the box 26 is not electrically conductive, the protection material 24 of the outside container 34 may be contacted with the leadframe 22 in the box 26 through a conductive medium (not shown, such as a conductive wire) contacted with the protection material 24 of the outside container 34 and extending inwardly through the window(s) 33 of the box 26 to the leadframe 22.

One or more of the box 26 may be accommodated in the space 36 of the outside container 34. The space 36 of the outside container 34 may have a configuration, shape, size, etc., corresponding to the leadframe 22 and/or the box 26, to receive and accommodate the box 26, and in turn the leadframe 22. For example, when the leadframe 22 is a rectangular sheet, the box 26 may be a rectangular box, the space 36 of the outside container 34 may be rectangular and/or square, and the outside container 34 may be a rectangular or square container.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A method for protecting leadframe, comprising steps of:

providing a leadframe of a first standard electrode potential;

providing a protection material of a second standard electrode potential, the second standard electrode potential being lower than the first standard electrode potential; and contacting the protection material with the leadframe without fixation therebetween so that the protection material acts as a sacrificial anode to protect the leadframe as a cathode from corrosion/oxidization.

2. The method according to claim 1, wherein the leadframe comprises Copper or Iron, and the protection material comprises at least one of Aluminum, Barium, Beryllium, Calcium, Cesium, Francium, Lithium, Magnesium, Potassium, Radium, Rubidium, Sodium, Strontium, and Zinc.

3. The method according to claim 1, wherein the leadframe comprises a Copper alloy or an Iron alloy, and the protection material comprises at least one of Aluminum, Barium, Beryllium, Calcium, Cesium, Francium, Lithium, Magnesium, Potassium, Radium, Rubidium, Sodium, Strontium, and Zinc.

4. The method according to claim 1, wherein the first standard electrode potential is in a range of from −0.5V to 0.8V, by using Standard Hydrogen Electrode.

5. The method according to claim 1, wherein the second standard electrode potential is in a range of from −3.5V to −0.7V, by using Standard Hydrogen Electrode.

6. The method according to claim 1, wherein the step of contacting the protection material with the leadframe so that the protection material acts as a sacrificial anode to protect the leadframe as a cathode from corrosion oxidization comprises: directly contacting the protection material with the leadframe.

7. The method according to claim 1, wherein the step of contacting the protection material with the leadframe so that the protection material acts as a sacrificial anode to protect the leadframe as a cathode from corrosion oxidization comprises: packaging the leadframe with a box comprising the protection material.

8. The method according to claim 1, wherein the step of contacting the protection material with the leadframe so that the protection material acts as a sacrificial anode to protect the leadframe as a cathode from corrosion/oxidization comprises: packaging the leadframe with a box made of the protection material.

9. The method according to claim 1, wherein the step of contacting the protection material with the leadframe so that the protection material acts as a sacrificial anode to protect the leadframe as a cathode from corrosion oxidization comprises: packaging the leadframe with a box comprising the protection material contactable with one side of the leadframe.

10. The method according to claim 1, wherein the step of contacting the protection material with the leadframe so that the protection material acts as a sacrificial anode to protect the leadframe as a cathode from corrosion/oxidization comprises: stacking the leadframe with the protection material in a box.

11. The method according to claim 1, wherein the step of contacting the protection material with the leadframe so that the protection material acts as a sacrificial anode to protect the leadframe as a cathode from corrosion/oxidization comprises: contacting the protection material with a surface of the leadframe in a box.

12. The method according to claim 1, wherein the step of contacting the protection material with the leadframe so that the protection material acts as a sacrificial anode to protect the leadframe as a cathode from corrosion/oxidization comprises: disposing the protection material face to face with the leadframe in a box.

13. The method according to claim 1, wherein the step of contacting the protection material with the leadframe so that the protection material acts as a sacrificial anode to protect the leadframe is a cathode from corrosion oxidization comprises: accommodating a box packaging the leadframe in a space of an outside container comprising the protection material.

14. A method for protecting leadframe, comprising steps of:

providing a leadframe of a first standard electrode potential;

providing a protection material of a second standard electrode potential, the second standard electrode potential being lower than the first standard electrode potential; and contacting the protection material with the leadframe so that the protection material acts as a sacrificial anode to protect the leadframe as a cathode from corrosion/ oxidization, wherein the step of contacting the protection material with the leadframe so that the protection material acts as a sacrificial anode to protect the leadframe as a cathode from corrosion oxidization comprises: packaging the leadframe with a box comprising the protection material and a movable wall.

* * * * *